Jan. 23, 1968 J. D. BRATSCH 3,365,539

STRAIN-RELIEVED ELECTRICAL LEAD CONNECTOR
SYSTEM FOR WIRE-WRAP ELECTRONIC MODULE
Filed Sept. 20, 1966

INVENTOR
JAMES D. BRATSCH
BY Thomas J. Nikolai
ATTORNEY

United States Patent Office 3,365,539

Patented Jan. 23, 1968

3,365,539

STRAIN-RELIEVED ELECTRICAL LEAD CONNECTOR SYSTEM FOR WIRE-WRAP ELECTRONIC MODULE

James D. Bratsch, Minneapolis, Minn., assignor to Sperry Rand Corporation, New York, N.Y., a corporation of Delaware Filed Sept. 20, 1966, Ser. No. 580,694
5 Claims. (Cl. 174—88)

Figures 1, 2, 3, 4:
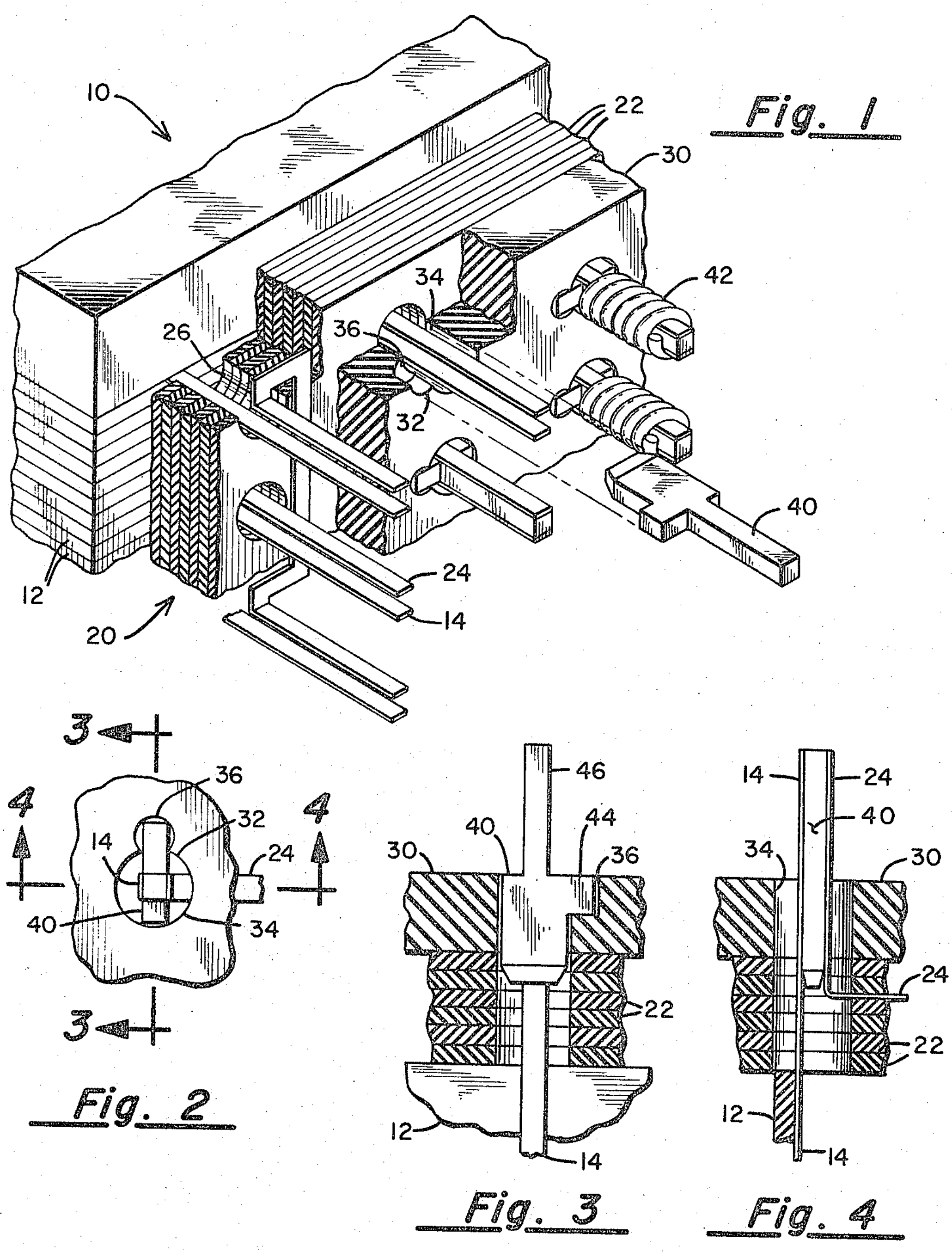

The present invention relates in general to a connector for an electronic module and has particular application to a strain relieving connector pin for the fragile electrical leads emanating from the memory planes of a multilayered magnetic memory system.

With the advent of the mass production of digital computers, it has been becoming increasingly desirable to utilize large numbers of similar circuits packaged in individual plug-in modules, or "card-types." Such circuits have, in the past, been mounted on printed circuit boards with all components affixed thereto in a substantially permanent manner with the entire assembly coupled into the system by mounting in plug-in type rack mounts. With the need for more highly compact packaging techniques, a still further improvement in high density packaging has resulted in a new field of "microelectronics" which field may be defined as that entire body of electronic art that is connected with or applied to the realization of electronic systems of extremely small electronic parts. As electronic components have been reduced in size the size and the means of interconnecting such components has not achieved a proportional reduction. This has resulted in the anomaly that the electrical interconnecting and supporting means for such electrical components have assumed the greater portion of the overall packaging volume.

Many methods for reducing the volume and complexity of the interconnecting and supporting means for such microelectronics components have been proposed. These methods include the so-called "cord-wood" approach and various intercircuit arrangements including multilayered printed circuit wiring. Further, methods of interconnecting electrical leads including dip soldering, welding and wire wrapping have been developed to automate, as much as possible, the packing and interconnection of such components. The present invention is directed toward a means of implementing the well-known wire-wrap technique for the fabrication of a three-dimensional memory system.

This present invention permits the electrical interconnection of printed circuit type drive and sense line electrical conductors that are magnetically coupled to the individual magnetic elements thereof. As printed circuit conductors are too fragile to permit the use of wire-wrap techniques directly thereto, it has been the prior-art practice to terminate such printed circuit conductors at relatively sturdy end terminals and then wire-wrap these end terminals. However, the addition of such sturdy end terminals normally requires at least one additional corresponding solder joint. Applicant's proposed method is to utilize the two printed circuit conductors that are to be interconnected in combination with a single wire-wrap pin. The pin is press-fit into an insulated block so as to absorb the torque of the wire-wrap machine. The pin provides means whereby the two printed circuit conductors are secured structurally while the wire-wrap coil provides the electrical interconnection therebetween. Not only does this eliminate the need for soldering and the use of separate conductors, but the use of the wire-wrap technique permits laminated interconnection of the individual pin-conductor terminals or of the interconnection of a plurality of individually pin-conductor terminals or of the interconnection of a plurality of individually pin-conductor terminals such as disclosed in the article, "Wiring Terminal Panels by Machine," Control Engineering, August 1961, pages 77–81. Further, as such wire-wrap coils are easily removed, applicant's invention permits an ease of disconnecting the pin-conductor termination if such is desired.

Accordingly, it is a primary object of the present invention to provide a means whereby printed circuit conductors may be interconnected by a wire-wrap technique.

It is a further object of the present invention to provide a wire-wrap pin that is press-fit into an insulated block so as to absorb the torsional strain of the torque produced by a wire-wrap machine when intercoupling two printed circuit conductors on such pin.

These and other more detailed and specific objectives will be disclosed in the following specification, reference being had to the accompanying drawings.

With particular reference to FIG. 1 there is illustrated an isometric view of a preferred embodiment of the present invention. In the illustrated utilization of applicant's invention there is illustrated a three-dimensional magnetic memory array that may be of a construction similar to that of the patent application of R. J. Bergman et al., Ser. No. 504,543, filed Oct. 24, 1965, and assigned to the Sperry Rand Corporation as is the present invention. Array 10 includes a plurality of two-dimensional memory arrays 12, commonly referred to as memory planes, each of which provides a plurality of very thin electrical leads 14 each of which for the present discussion may be considered to be a common bit-sense line that is coupled to all the magnetic memory elements of the memory plane 12. Memory leads 14 may be of a printed circuit construction or of a separate element electrically intercoupled to the common bit-sense line of the associated memory plane 12. As each memory plane 12 is in the order of 0.012 inch in thickness, it is apparent that such leads 14 emanating therefrom must be of a leaf-like construction and may be constructed of beryllium-copper, or any other suitable conductive material, extending a sufficient distance from the edge of the associated memory plane 12 to permit electrical interconnection therewith. Leads 14, in the preferred embodiment illustrated in FIG. 1, are of a beryllium-copper construction having a width of 0.020 inch, and a thickness of 0.0045 inch and projected 0.280 inch from the edge of the associated memory plane 12.

Associated with array 10 is an intrastack connection array 20 including a plurality of printed circuit boards 22 each having a plurality of asosciated intercoupled intrastack connection leads 24 each of which is associated with a related lead 14 for the purpose of providing electrical interconnection between two or more leads 14, i.e., intrastack connections. Intrastack connection array 20 has a plurality of apertures 26 therethrough having a pattern conforming to the pattern of the memory plane 12 leads 14 for permitting the free passage of such leads 14 therethrough. Additionally, selected intrastack connection boards 22 have their associated interplane connection leads 24 extending through associated apertures 26 in a predetermined pattern to permit electrical intercoupling with associated leads 14. In the illustrated embodiment interplane connection leads 24 were of the same material and of the same dimensions as memory plane 12 leads 14 and were arranged in electrical and mechanical cooperative relationship therewith.

On top of intrastack connection array 20 and forming a sandwiched construction with array 10 is insulator block 30. Block 30 is constructed of an electrically insulative material and is of a sufficient structural strength to accommodate the torque produced therein by the wire-wrap machine through pin 40. Block 30 has a plurality of keyways 32 each of which consists of an aperture 34 and a depression, or slot 36, which keyways 32 are arranged in the predetermined pattern established by the memory plane 12 leads 14 of array 10 and which individually are of such a design to accommodate a press-fit insertion of pin 40. Pin 40 may be of an electrical conductive or insulative material as electrical interconnection between the associated memory plane 12 lead 14 and the intrastack connection lead 24 is accomplished by wire-wrap coil 42. Wire-wrap coil 42 may be installed by any one of many well-known hand tools or may be installed by a Gardner-Denver Company wire-wrap machine under the automatic control of a computer system such as the arrangement disclosed in the copending application of J. P. Holmgren et al., Ser. No. 323,969, filed Nov. 15, 1963, and assigned to the Sperry Rand Corporation as is the present invention.

With particular reference to FIG. 2 there is presented an illustration of a single keyway 32 in block 30 and the associated elements pertinent to the present invention. In the assembly of array 10, intrastack connection array 20 and block 30 are aligned in a properly oriented manner with the predetermined pattern of the memory plane 12 leads 14 emanating from the individual memory planes 12 of array 10. With pairs of leads 14 and 24 properly oriented in their respectively associated keyway 32, pin 40 is inserted in keyway 32 in a press-fit forming a secure installation in block 30 between leads 14 and 24. With key 44 of pin 40 secured in the depression 36 of keyway 32, pin 40 is securely constrained in a rotational direction about its longitudinal axis whereby torque presented to its terminal portion 46 by the wire-wrap machine through coil 42 is restrained preventing the presentation of any torsional stress about leads 14 and 24.

With particular reference to FIG. 3 there is illustrated a sectional view of the installation of pin 40 in keyway 32 as taken along line 3—3 of FIG. 2. This sectional view illustrates the installation of pin 40 in keyway 32, particularly in depression 36, wherein key 44 of pin 40 establishes the depth of the insertion of pin 40 in keyway 32 while presenting torsional rigidity during the wire-wrap operation.

With particular reference to FIG. 4 there is illustrated a sectional view of the installation of pin 40 in keyway 32 as taken along line 4—4 of FIG. 2. This figure particularly illustrates the relationship of lead 14 and its associated memory plane 12, interplane 24 of the associated intrastack connector 22, and pin 40.

In order to appreciate the dimensions and sizes of the components involved some typical connections may be presented. In a typical embodiment of applicant's invention, such as illustrated in FIG. 1, the center-to-center spacing of keyways, and of course the associated leads 14 and 24 and pin 40, was 0.100 inch. This center-to-center spacing accommodates typical wire-wrap machine capabilities. Pin 40 and leads 14 and 24, projected from the outside surface of block 30 at a typical dimension of 0.100 inch, and an overall sandwich dimension of pin 40 and leads 14 and 24 being 0.020 x 0.029 inch with a lengthwise projection of 0.100 inch from block 30.

Thus, it is apparent that applicant has, by using a torsional stress relieving pin in a restraining press-fit keyway in an insulated block, provided a means whereby foil-like electrical leads, each of insufficient structural ability, may utilize a wire-wrap electrical intercoupling technique. It is understood that suitable modifications may be made in the structure as disclosed provided that such modifications come within the spirit and scope of the appended claims. Having, now, fully illustrated and described my invention, what I claim to be new and desire to protect by Letters Patent is:

What is claimed is:

1. In an electrical lead termination for a wire-wrap interconnection, the combination comprising:

an electrical component having a plurality of foil-like first electrical leads of insubstantial structural strength projecting therefrom in a predetermined spaced-apart pattern;

electrical interconnecting means adjacent said electrical component and having a plurality of apertures therethrough in said predetermined spaced-apart pattern;

said electrical interconnecting means including a plurality of electrical conductors each having at least two foil-like second electrical leads of insubstantial structural strength, said second electrical leads projecting through said apertures in said predetermined spaced-apart pattern;

stress supporting means adjacent said electrical interconnecting means and having a plurality of apertures therethrough in said predetermined spaced-apart pattern, each of said apertures forming a keyway;

said first electrical leads projecting through the apertures in said electrical interconnecting means and said stress supporting means, one each of said first electrical leads associated with a corresponding one of said second electrical leads in a corresponding one of said keyways;

a plurality of keyway pins, one each inserted in an associated one of said keyways in a press-fit relationship therewith for providing a torsional stress restraining relationship with said stress supporting member and each associated with corresponding ones of said first and second leads; and, a plurality of wire-wrap coils one each wrapped around the associated ones of said first and second leads and said pins for electrically interconnecting the first electrical leads that are associated with the two second electrical leads of the associated one of said electrical conductors.

2. In an electrical lead termination for a wire-wrap interconnection, the combination comprising:

a stress supporting member having a first surface with an aperture therethrough for forming a keyway;

a first foil-like electrical lead of insubstantial structural strength projecting from said first surface through said keyway;

a second foil-like electrical lead of insubstantial structural strength projecting from said first surface though said keyway in a predetermined relationship with said first lead;

a keyway pin for insertion in said keyway and having a press-fit relationship therewith for providing a torsional stress restraining relationship with said supporting member and projecting from said first surface;

said first and second leads positioned adjacent said pin;

a wire-wrap coil wrapped about said first and second leads and said pin for providing electrical interconnection between said first and second leads.

3. The combination of claim 2 wherein said supporting member is a layer of electrically insulative material.

4. The combination of claim 3 wherein said first and second leads are of a copper-alloy foil of less than 0.010 inch in thickness.

5. The combination of claim 4 wherein said first and second leads sandwich said pin therebetween in a parallel relationship.

References Cited

UNITED STATES PATENTS

| | | | |
|---|---|---|---|
| 2,726,376 | 12/1955 | Heath | 339—278 X |
| 2,959,762 | 11/1960 | Schlee | 339—276 X |
| 3,002,045 | 9/1961 | Ayer | 339—276 X |
| 3,233,034 | 2/1966 | Grabbe | 339—276 XR |
| 3,283,291 | 11/1966 | Krol et al. | 339—276 |

FOREIGN PATENTS

| | | |
|---|---|---|
| 915,552 | 1/1963 | Great Britain. |
| 1,005,130 | 9/1965 | Great Britain. |

MARVIN A. CHAMPION, *Primary Examiner.*

PERRY TEITELBAUM, *Assistant Examiner.*